United States Patent [19]

Saito et al.

[11] Patent Number: 5,442,199

[45] Date of Patent: Aug. 15, 1995

[54] DIAMOND HETERO-JUNCTION RECTIFYING ELEMENT

[75] Inventors: Kimitsugu Saito; Koichi Miyata, both of Kobe, Japan; Kalyankumar Das, Raleigh, N.C.

[73] Assignee: Kobe Steel USA, Inc., Research Triangle Park, N.C.

[21] Appl. No.: 62,051

[22] Filed: May 14, 1993

[51] Int. Cl.$^6$ .................... H01L 29/161; H01L 29/04
[52] U.S. Cl. ...................... 257/77; 257/627; 257/49; 257/52; 257/75
[58] Field of Search ................ 257/77, 183, 627, 628, 257/49, 51, 52, 64, 75; 437/100

[56] References Cited

U.S. PATENT DOCUMENTS

| | | | |
|---|---|---|---|
| 3,904,505 | 9/1975 | Aisenberg | 204/298 |
| 3,961,103 | 6/1976 | Aisenberg | 427/39 |
| 4,670,968 | 6/1987 | Mikami et al. | 29/576 B |
| 4,806,900 | 2/1989 | Fujimori et al. | 338/22 R |
| 4,822,466 | 4/1989 | Rabalais et al. | 204/192.15 |
| 4,891,329 | 1/1990 | Reisman et al. | 436/61 |
| 5,002,899 | 3/1991 | Geis et al. | 437/173 |
| 5,066,938 | 11/1991 | Kobashi et al. | 338/22 SD |
| 5,082,359 | 1/1992 | Kirkpatrick | 359/642 |
| 5,086,014 | 2/1992 | Miyata et al. | 437/103 |
| 5,089,802 | 2/1992 | Yamazaki | 338/22 SD |
| 5,099,790 | 3/1992 | Kawakami | 118/723 |
| 5,104,634 | 4/1992 | Calcote | 523/446 |
| 5,114,696 | 5/1992 | Purdes | 423/446 |
| 5,124,179 | 6/1992 | Garg et al. | 427/249 |
| 5,126,206 | 6/1992 | Garg et al. | 428/408 |
| 5,127,983 | 7/1992 | Imai et al. | 156/610 |
| 5,145,712 | 9/1992 | Jesser et al. | 427/38 |
| 5,169,676 | 12/1992 | Moran et al. | 427/575 |
| 5,171,732 | 12/1992 | Hed | 505/1 |
| 5,173,761 | 12/1992 | Dreifus et al. | 257/22 |
| 5,183,530 | 2/1993 | Yamazaki | 156/643 |
| 5,204,145 | 4/1993 | Gasworth | 427/577 |
| 5,221,411 | 6/1993 | Narayan | 156/603 |
| 5,225,366 | 7/1993 | Yoder | 437/108 |
| 5,236,545 | 8/1993 | Pryor | 156/613 |
| 5,244,712 | 9/1993 | Eden | 428/142 |
| 5,250,149 | 10/1993 | Kimoto et al. | 156/612 |
| 5,252,174 | 10/1993 | Deguchi et al. | 156/612 |

FOREIGN PATENT DOCUMENTS

| | | |
|---|---|---|
| 445998A1 | 9/1991 | European Pat. Off. . |
| 59-27754 | 2/1984 | Japan . |
| 59-137396 | 8/1984 | Japan . |
| 60-12747 | 1/1985 | Japan . |
| 61-3320 | 1/1986 | Japan . |
| 61-251158 | 11/1986 | Japan . |
| 6455863 | 3/1989 | Japan . |
| 6468966 | 3/1989 | Japan . |
| 1158774 | 6/1989 | Japan . |
| 1244399 | 9/1989 | Japan . |
| 2273960 | 11/1990 | Japan . |
| 312966 | 1/1991 | Japan . |
| 394429 | 4/1991 | Japan . |
| 3120865 | 5/1991 | Japan . |
| 3160731 | 7/1991 | Japan . |
| 3263872 | 11/1991 | Japan . |
| 3278463 | 12/1991 | Japan . |
| 3278474 | 12/1991 | Japan . |
| 426161 | 1/1992 | Japan . |
| 426172 | 1/1992 | Japan . |
| 2252202 | 7/1992 | United Kingdom . |

OTHER PUBLICATIONS

Geis, *Growth of textured diamond films on foreign substrates from attached seed crystals*, Appl. Phys. Lett., 55:550–552 (1989).

Primary Examiner—Mark V. Prenty
Attorney, Agent, or Firm—Bell, Seltzer, Park & Gibson

[57] ABSTRACT

An undoped highly-oriented diamond film is formed on a single crystalline silicon substrate, a p-type highly-oriented diamond film is formed on the insulating diamond film. An ohmic electrode is formed on said p-type semiconducting diamond film and an ohmic electrode is also formed on a n-type $\beta$-SiC layer. The highly-oriented diamond films are grown by chemical vapor deposition and at least 80% of the surface area of said diamond film consists of either (100) or (111) crystal planes, and the differences $\{\Delta\alpha, \Delta\beta, \Delta\gamma\}$ of Euler angles $\{\alpha, \beta, \gamma\}$, which represent the orientations of the crystals simultaneously satisfy the following relations: $|\Delta\alpha|\leq 5°$, $|\Delta\beta|\leq 5°$ and $|\Delta\gamma|5°$ between adjacent crystal planes. The diamond hetero-junction rectifying element thus made has a high rectification ratio and heat resistance, and is suitable for mass production at low cost and on large scale.

6 Claims, 10 Drawing Sheets

SURFACE STRUCTURE OF DIAMOND FILM
WITH HIGHLY ORIENTED (100) CRYSTAL PLANE

STANDARD ORIENTATION OF
CRYSTAL PLANE

SURFACE STRUCTURE OF DIAMOND FILM
WITH HIGHLY ORIENTED (100) CRYSTAL PLANE

DIAMOND HETERO-JUNCTION RECTIFYING ELEMENT

BACKGROUND OF THE INVENTION

1. Field of the Invention

The present invention relates to a diamond hetero-junction rectifying element comprising a diamond film and a film of either silicon carbide or silicon, and having an excellent heat resistance.

2. Prior Art References

Diamond is a very hard material and has a high thermal conductivity as well as an excellent resistance to heat, radiation and chemicals. Recently, it became possible to prepare a diamond film by chemical vapor deposition (CVD). A speaker diaphragm and a heat sink for an electronic device are being developed. Diamond free from impurities is insulating, but diamond can be converted to p-type semiconductor by doping. The band gap of the p-type semiconductor is as large as about 5.4 eV. Moreover, its semiconducting characteristics persists at high temperature above 100° C. Its dielectric breakdown voltage is about 30 times higher than that of silicon (Si). Therefore, there is an interest in the application of diamond for high temperature and high power electronic elements. A p-n junction rectifying element is one of the targets of development.

In order to obtain a p-type semiconducting diamond, B is doped in the diamond film. To obtain n-type semiconducting diamond, Si or P is doped. However, n-type semiconducting diamond having good electrical properties have not been successfully obtained. Therefore, a hetero-junction using a n-type non-diamond semiconducting material is considered. For example, a rectifying element comprising p-type diamond and n-type amorphous silicon (hereinafter referred as to a-Si:H) has been proposed (Hideo Kiyota, Masahiro Yoneda, Hiroshi Izumiya, Hideyo Okushi, Ken Okano, Tateki Kurosu and Masamori Iida, Japanese Journal of Applied Physics, Vol.31, No.4A, Part 2, pp. L388–L391, 1992: hereinafter referred to as prior art references 1).

FIG. 11 is a cross-sectional view showing an a-Si:H/diamond hetero-junction rectifying element according to the prior art reference 1. Here, a p-type polycrystalline diamond film 3 is formed on a single crystal silicon substrate 4, a n-type a-Si:H layer 2 is formed on the p-type polycrystalline diamond film 3, and an ohmic electrode 1 made of Mg is selectively formed on the n-type a-Si:H layer 2. An ohmic electrode 5 made of Au is formed on the back surface of the single crystal silicon substrate 4. In the prior art reference 1, a rectification ratio of $10^2$ to $10^3$ was obtained from room temperature to 100° C. In other prior art rectifying elements having a p-type diamond film and a n-type a-Si:H layer, a rectification ratio of $10^2$ has been obtained at room temperature.

FIG. 12 shows a prior art p-n-p type hetero-junction bipolar transistor (HBT) comprising a diamond film and a cubic silicon carbide ($\beta$-SiC) (Japanese under Provisional Publication sho 64-55862, hereinafter referred to as prior art reference 2). In this diamond HBT, a p-type $\beta$-SiC layer 7 as a collector is formed on a single crystal diamond substrate 6. A n-type $\alpha$-SiC layer 8 as a base is selectively formed on the p-type $\beta$-SiC layer 7. Further, a p-type polycrystalline diamond film 3 as an emitter is selectively formed on the n-type beta-SiC layer 8. Ohmic electrodes 9 made of Au/Mo/Ti multi-layers are formed on each of the p-type $\beta$-SiC layer 7, the n-type $\beta$-SiC layer 8 and the p-type polycrystalline diamond film 3.

The a-Si:H layer 2 used in the prior art reference 1 as the n-type semiconductor, however, is not suitable for use at high temperature because hydrogen is released at temperatures higher than about 350° C.

In the prior art reference 2, the $\beta$-SiC layer 8 having an excellent heat stability is used as the n-type semiconductor, and therefore there is no such problem. In this prior art reference 2, the diamond layer is formed on the n-type $\beta$-SiC layer 8 by the microwave plasma CVD method (microwave power: 400 W, source gas: $C_5H_8$:0.2%+$B_2H_6$:0.5 ppm+$H_2$:99.8%, gas pressure: 30 Torr). However, this method provides polycrystalline diamond film. Such a film contains many grain boundaries and crystal defects. Therefore, if the element is operated in air at high temperature, the diamond film is oxidized and graphitized gradually along the grain boundary.

If the p-n junction is formed using a p-type polycrystalline diamond film 3 and a n-type $\beta$-SiC layer 8, grain boundaries crystal defects cause a current leakage in the reverse bias conditions (positive bias to the n-type semiconductor).

As shown in FIG. 13, no such problem occurs, if a rectifying p-n junction element is provided by a single crystal diamond substrate 6 and a p-type single crystal diamond film 10 formed on said single crystal diamond substrate 6. In FIG. 13, the p-type single crystal diamond film 10 is formed on the single crystal diamond substrate 6 and the n-type $\beta$-SiC layer 8 is selectively formed on the p-type single crystal diamond film 10. An ohmic electrode 11 is formed on the n-type $\beta$-SiC layer 8 and an ohmic electrode 12 made of a Au/Ti bilayer is formed on the p-type single crystal diamond film 10.

Since the single crystal diamond is expensive, the manufacturing cost is high. In addition, the surface area of the commercially available single crystal diamond is limited to about $5\times 5$ mm$^2$. Therefore, mass production of single crystal devices is not practical.

SUMMARY OF THE INVENTION

It is an object of the present invention to provide a diamond hetero-junction rectifying element having good rectifying characteristics and heat resistance, is suitable for mass production at low cost and simultaneously a large scale.

A diamond hetero-junction rectifying element according to the present invention comprises a diamond film and a film of either silicon carbide or silicon. Said diamond film is a highly-oriented diamond film grown by CVD. At least 80% of the surface area of said highly-oriented diamond film consists of either (100) or (111) crystal planes. The differences $\{\Delta\alpha, \Delta\beta, \Delta\gamma\}$ of Euler angles $\{\alpha, \beta, \gamma\}$, which represent the orientations of the crystal planes, simultaneously satisfy the following relations between adjacent crystal planes: $|\Delta\alpha|\leq 5°$, $|\Delta\beta|\leq 5°$ and $|\Delta\gamma|\leq 5°$.

FIGS. 1A and 1B show diagrammatically the surface structure of a diamond film of the invention wherein the (100) crystal plane is highly-oriented according to this invention. FIG. 1A defines the x-axis and the y-axis which cross at right angles to each other in the film surface, and the z-axis along the film surface normal. As shown in FIG. 1B, the Euler angles indicating the orientations of the crystal planes of the (i)th diamond crystal and the adjacent (j)th diamond crystal are denoted as $\{\alpha_i, \beta_i, \gamma_i\}$ and $\{\alpha_j, \beta_j, \gamma_j\}$, respectively, and the angle difference between the two planes is denoted as $\{\Delta\alpha, \Delta\beta, \Delta\gamma\}$.

The Euler angles $\{\alpha, \beta, \gamma,\}$ indicate the orientation of the crystal plane that can be attained by rotating the standard crystal plane about the standard coordinate axis z, y and z by the angles $\alpha$, $\beta$ and $\gamma$ one after another.

According to this invention, the relation between adjacent crystal planes of the highly oriented diamond film satisfies $|\Delta\alpha| \leq 5°$, $|\Delta\beta| \leq 5°$ and $|\Delta\gamma| \leq 5°$ simultaneously. It therefore follows that the crystals are oriented to a high degree and that the carrier mobility as is high as a single crystal diamond film.

For the case of crystals with the (111) crystal plane, the crystals are highly-oriented as well and the hole mobility becomes high when all the absolute values of the differences in Euler angles are below 5°. Such a highly-oriented diamond film can be formed, for instance, by subjecting a mirror-finished silicon substrate to microwave radiation while applying a negative bias to the substrate in an atmosphere comprising methane, then growing diamonds in an appropriate source gas.

In the present invention of the highly-oriented diamond film, at least 80% of the surface area is covered by either (100) or (111) planes. Since the misorientation of the crystal planes in the highly-oriented diamond film is within ±5°, the effect of grain boundaries on electronic properties can be negligible unlike polycrystalline diamond films.

Therefore, the present invention can provide a rectifying element with a high rectification ratio, a high carrier mobility and small leakage current under the reverse bias conditions. The dielectric breakdown voltage is also high. In addition, commercially available inexpensive silicon wafers can be used for the substrates and the highly-oriented diamond film can be grown on a large area. Thus, it is possible to produce many rectifying elements simultaneously at low manufacturing cost.

As for the n-type semiconducting layer, either silicon carbide (SIC) or silicon can be used. Like diamond, SiC is excellent in heat resistance, and therefore can be used at high temperature. Its dielectric breakdown field is high, so that it can be operated at high voltage.

For the n-Type silicon material, amorphous silicon (a-Si:H), micro-crystalline silicon ($\mu$c-Si) or polycrystalline silicon (poly-Si) can be used. a-Si:H can be prepared at lower temperature than $\mu$c-Si and poly-Si, and a-Si:H does not require heat treatment. Therefore, the manufacturing process can be simplified. a-Si:H and $\mu$c-Si have a flatter surface than poly-Si. Therefore, they are preferable to obtain an uniform field strength in rectifying elements. Poly-Si has a higher heat resistance than a-Si:H and $\mu$c-Si. If these Si materials are impurity-doped at high concentration, the depletion layer is expanded towards the diamond layer and a high dielectric breakdown voltage can be achieved. Changes in carrier concentration in Si at different temperatures are small, and therefore the electrical properties of the n-type semiconductor are stable. Although oxidation reactions take place at the Si surface in air at high temperature, the oxidized film is very thin and stable.

BRIEF DESCRIPTION OF THE DRAWINGS

FIG. 1A shows the standard orientation of the crystal plane, while FIG. 1B shows the surface structure of highly-oriented diamond film with (100) planes;

DETAILED DESCRIPTION OF THE PREFERRED EMBODIMENTS

Figure 1A:
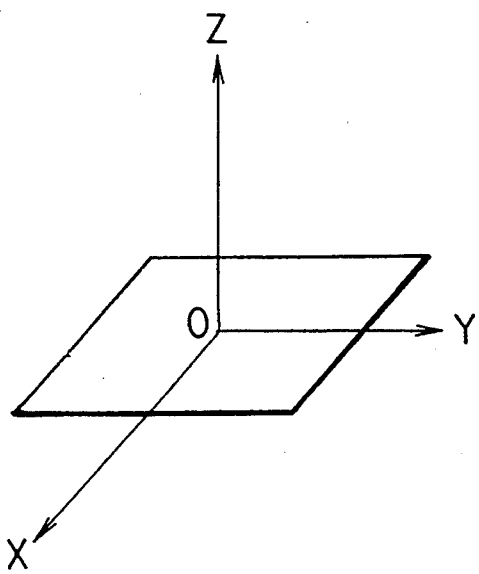
FIGS. 1A and 1B are diagrams showing the relationship between the surface structure of the highly-oriented diamond film and the Euler angles.
Figure 1B:
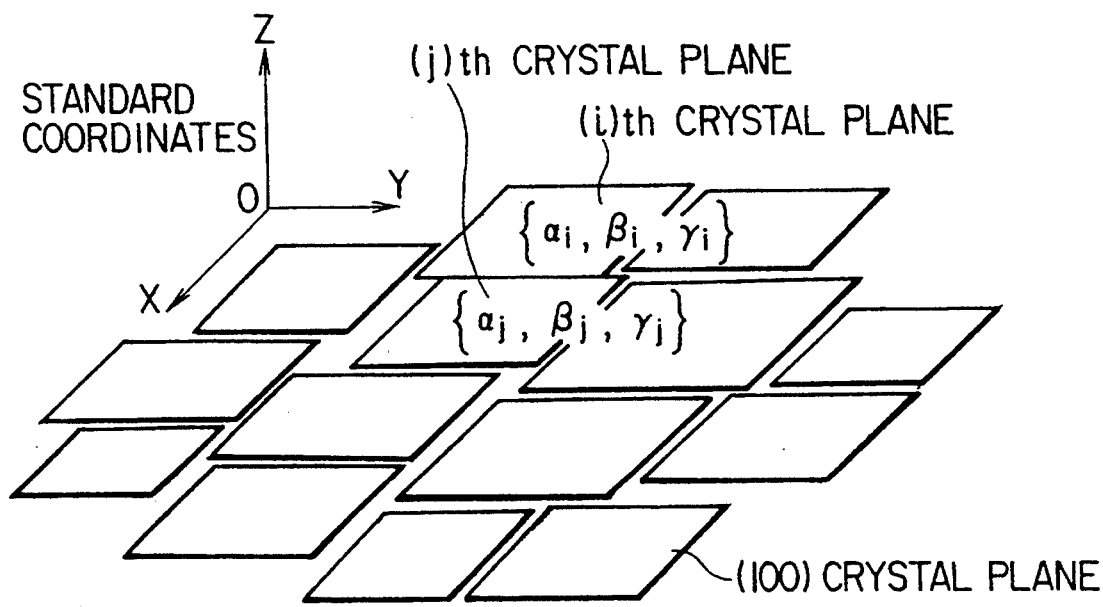
Figure 2:
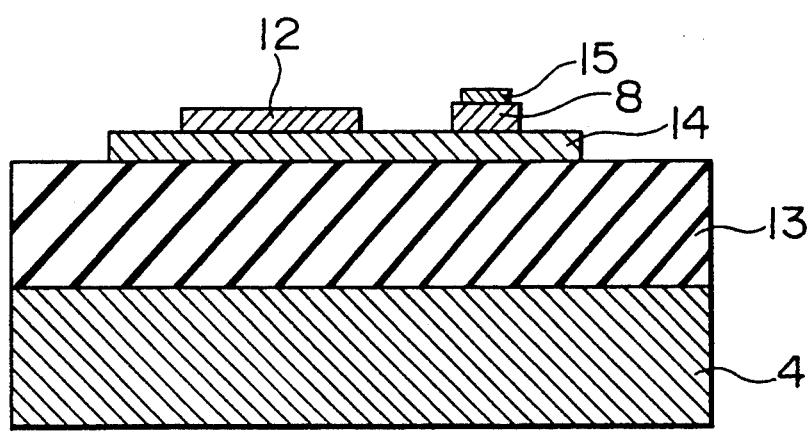
FIG. 2 is a cross-sectional view showing the diamond hetero-junction rectifying element according to the first embodiment of the present invention.

The embodiments of the present invention will be described. FIG. 2 is a cross-sectional view showing the diamond hetero-junction rectifying element according to the first embodiment of the present invention. An undoped highly-oriented diamond film 13 is formed on a single crystal silicon substrate 4. A p-type highly-oriented diamond film 14 is then formed on the insulating highly-oriented diamond film 13. An ohmic electrode 12 consisting of a Au/Ti bilayer is formed on the p-type semiconducting highly-oriented diamond film 14 and an ohmic electrode 15 of TaSi$_2$ film is formed on the n-type $\beta$-SiC layer 8 provided on the film 14 so as to obtain a p-n junction between the p-type highly oriented diamond film 14 and the n-type $\beta$-SiC layer 8.

In the following Example, diamond hetero-junction rectifying elements thus constructed and its characteristics are described together with a comparative example.

(Step 1)

An one inch silicon wafer (a single crystalline silicon substrate 4) of (100) cut was used as a substrate. The substrate was placed in a chamber for microwave plasma CVD and treated for about 20 minutes under the following conditions: the source gas was 2.8% methane and 97.2% hydrogen, the gas pressure was 30 Torr, the gas flow rate was 300 ml/min, and the substrate temperature was 720° C. Power source of about 1000 W was used to generate microwave, but the power was slightly adjusted so as to maintain the constant substrate temperature at 700° C. At the same time, a negative bias was applied to the substrate. The negative biasing current was 14 mA/cm$^2$.

(Step 2)

The diamond film deposition was continued for 35 hours under the following conditions: the source gas was 0.5% methane, 99.4% hydrogen and 0.1% of oxygen, the gas pressure was 35 Torr, the gas flow rate was 300 ml/min, and the substrate temperature was 800° C. As a result, the undoped diamond film 13 of about 15 μm thickness was obtained. An observation by electron microscope indicated that 82% of the film surface was covered by (100) crystal planes. From photographs of the film cross section, the maximum deviation of crystal plane positions was found to be 0.1 μm or less. Two electron micrographs of the film surface were taken at angle $+10°$ and $-10°$ from the film surface normal and the inclinations of the (100) crystal planes were determined. It was found that the differences of the surface inclinations between adjacent crystals satisfied all conditions of $|\Delta\alpha| \leq 5°$, $|\Delta\beta| \leq 5°$ and $|\Delta\gamma| \leq 5°$, and $(\Delta\alpha)^2 + (\Delta\beta)^2 + (\Delta\gamma)^2 = 53$.

(Step 3)

Sixteen samples of 4 mm×2.5 mm size p-type semiconducting diamond films were prepared on the undoped highly-oriented diamond film 13 by selectively growing the p-type semiconducting highly-oriented diamond film thereon. The film growth was performed for 7 hours under the following conditions: the source gas was 0.5% methane, 99.5% hydrogen and 0.1 ppm diborane ($B_2H_6$), the gas pressure was 35 Torr, the gas flow rate was 300 ml/min, and the substrate temperature was 800° C. As a result, a 1.5 μm thick p-type semiconducting highly-oriented diamond film was formed on the basal undoped film.

(Step 4)

In order to stabilize the electrical characteristics of diamond, the above samples were heat-treated for 30 minutes in vacuum at 850° C. Then, the samples were cleaned by a heated mixture of chromic oxide and sulfuric acid, followed by aqua regia and RCA cleanings.

(Step 5)

A 500 Å thick N-doped n-type β-SiC layer 8 was grown on the p-type semiconducting diamond film 14 by a thermal CVD method. The film growth was performed for 15 minutes under the following conditions: the source gas was 0.6% silane ($SiH_4$), 20 ppm nitrogen, 0.3% ethylene ($C_2H_4$), and 99.1% hydrogen, the gas pressure was 760 Torr, the gas flow rate was 300 ml/min, and the substrate temperature was 1400° C.

(Step 6)

A dot pattern of 300 μm in diameter was formed by etching the β-SiC layer 8 by plasma etching. The etching conditions were as follows: the etching gas was 50% oxygen, and 50% $CF_4$, the gas pressure was 0.005 Torr, and the radio frequency (RF) power was 200 W.

(Step 7)

In order to clean the diamond surface after the β-SiC layer 8 was etched out, the sample was cleaned in a heated mixture of chromic oxide and dense sulfuric acid, followed by aqua regia and RCA cleanings.

(Step 8)

Subsequently an ohmic electrode 12 (a dot of 2 mm in diameter) made of a Au/Ti bilayer and the other ohmic electrode 15 (a dot of 250 μm in diameter) made of $TaSi_2$, were formed. Then, each rectifying element was separated by a dicing saw to prepare the diamond/SiC rectifying element according to the first embodiment of the present invention shown in FIG. 2. This is referred to as example 1, hereafter.

As a comparative example 1, a rectifying element having the structure shown in FIG. 2 was prepared by the above conditions described in each Steps except Step 1. For the comparative example 1, the conditions of Step 1 was modified to the conditions for sample 3 of Table 1. The sample 2 of Table 1 was prepared according to the conditions in Step 1.

TABLE 1

| Sample No. | Synthetic conditions | | | Coverage by (100) plane (%) | $|\Delta\alpha|, |\Delta\beta|, |\Delta\gamma|$ |
|---|---|---|---|---|---|
| | $CH_4$ (%) | $H_2$ (%) | Substrate temp. (°C.) | | |
| 1 | 2.5 | 97.5 | 700 | 85 | All <5° |
| 2 | 2.8 | 97.2 | 720 | 82 | All <5° |
| 3 | 3.2 | 96.8 | 780 | 78 | All >5° |
| 4 | 3.6 | 96.4 | 810 | 74 | All >5° |

Figure 3:
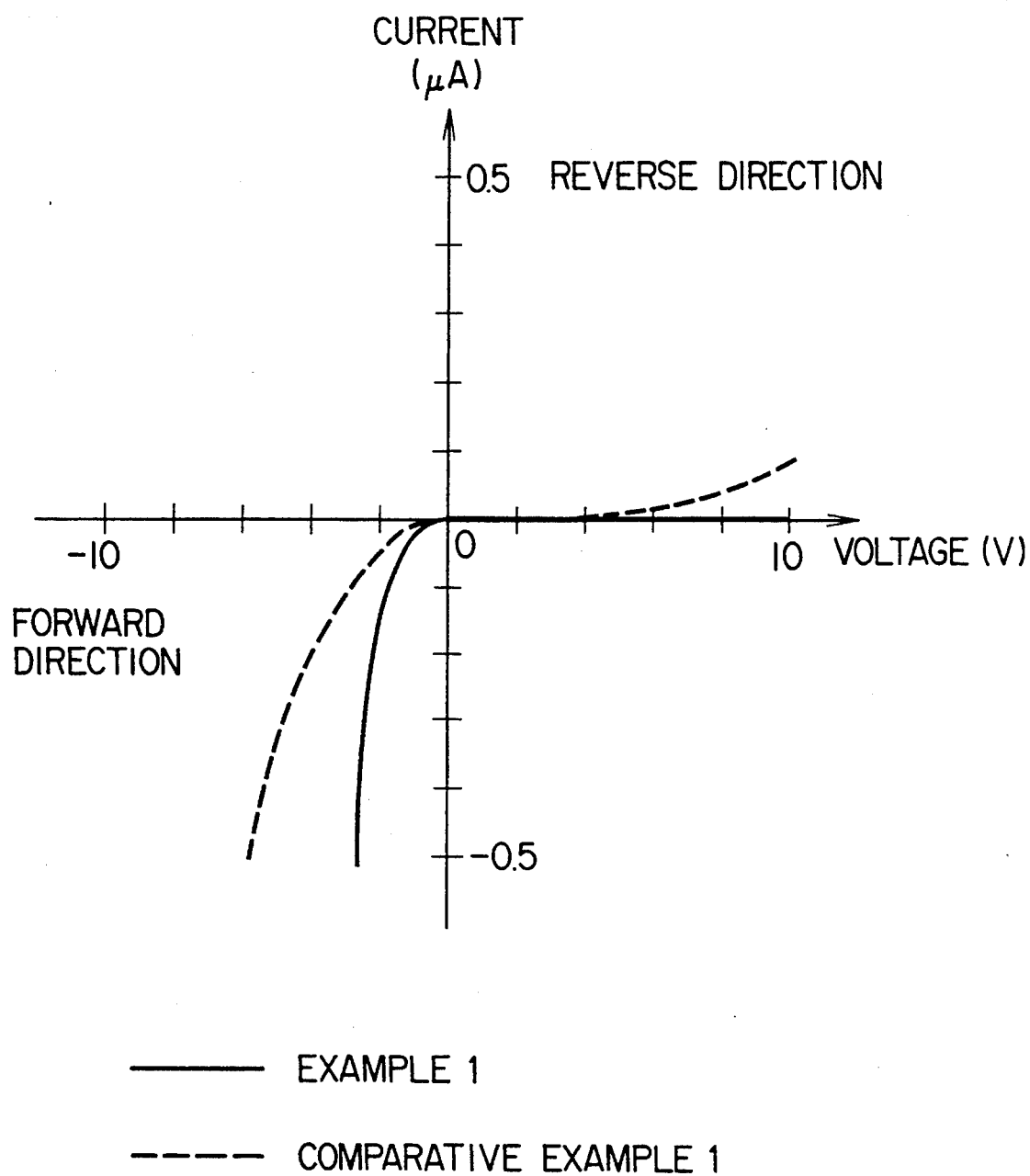
FIG. 3 is a graph showing the I-V characteristics of the hetero-junction rectifying element according to the example 1 of the present invention.
Figure 4:
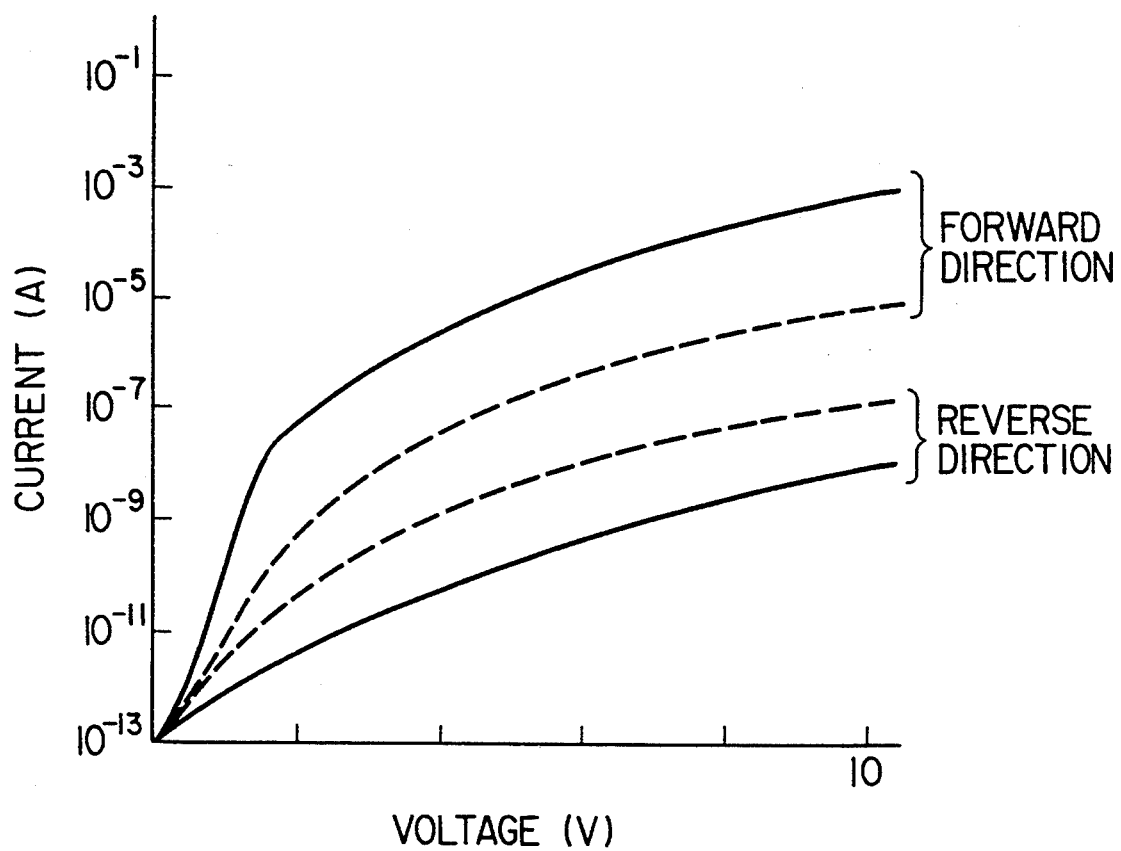
FIG. 4 is a graph showing the log I-V characteristics of the hetero-junction rectifying element according to the example 1 of the present invention.

The current-voltage (I–V) characteristics of the diamond/SiC rectifying element was measured for each sample prepared according to the example 1 and the comparative example 1, using a probe at room temperature (24° C.). In FIG. 3, the I–V characteristics are shown by the solid line for the example 1 and by the dotted line for the comparative example 1. In FIG. 4, the log I–V characteristics for the forward and the reverse directions are shown by the solid line for the example 1 and by the dotted line for the comparative example 1. As is clear from FIGS. 3 and 4, excellent rectifying characteristics were obtained for the element of the example 1 using the highly-oriented diamond film according to the present invention. The dielectric breakdown voltage of the rectifying element of the example 1 was about 93 V, and the rectifying effect existed even at high temperature of 500° C. in air.

Figure 5:
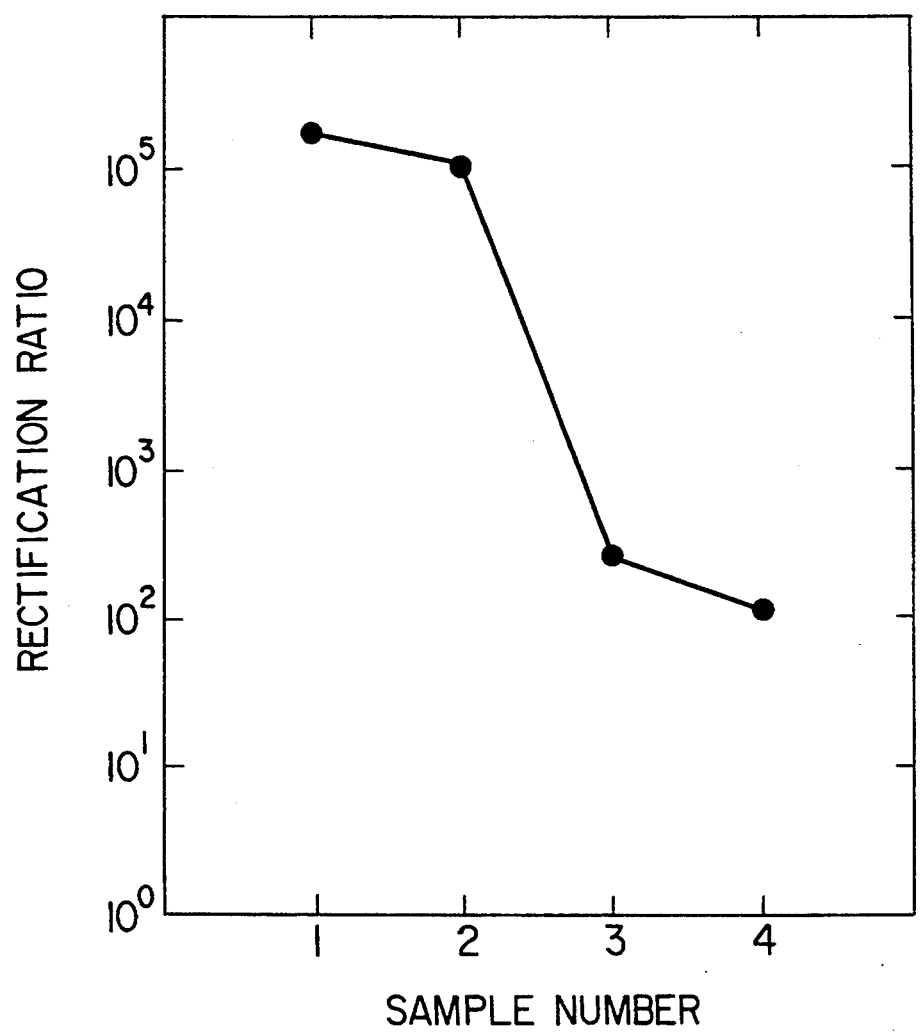
FIG. 5 is a graph showing the rectification ratio of the hetero-junction rectifying element according to the example 1 of the present invention, compared to the comparative example 1.

Diamond/SiC rectifying elements having the structure shown in FIG. 2 were prepared by changing the conditions of Step 1 of the example 1 as listed in the preceding Table 1 and their I–V characteristics were measured at room temperature (24° C.). The rectifying ratio at ±10 V is shown in FIG. 5. The rectifying ratio for the samples 1 and 2 according to the present invention was around $10^5$, while for the samples 3 and 4 (which are out of the scope of the present invention) it decreased significantly. Therefore, it is necessary to use the highly-oriented film defined in the present invention in order to obtain an excellent rectifying element.

Figure 6:
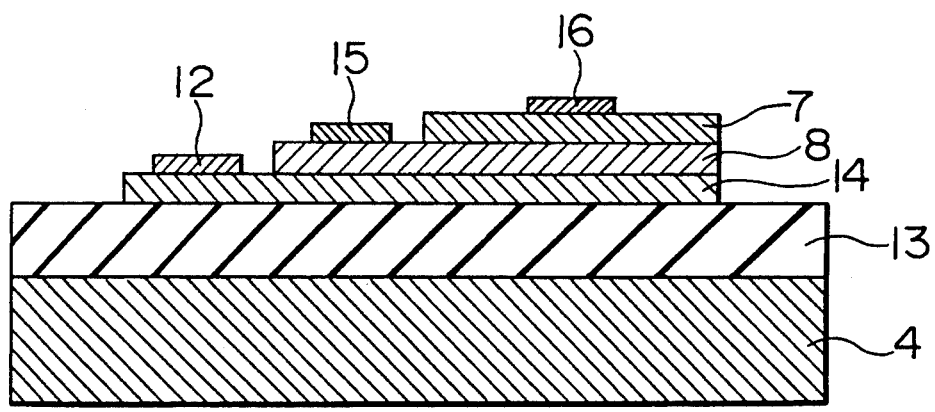
FIG. 6 is a cross-sectional view showing HBT utilizing the highly oriented diamond film according to the second embodiment of the present invention.

The diamond/SiC hetero-junction structure according to the present invention can be applied to other electronic element containing the same structure. One example is a HBT shown in FIG. 6. That is, an undoped highly-oriented diamond film 13 is formed on a silicon wafer 4 and a p-type highly-oriented diamond film 14 is formed on the undoped highly-oriented diamond film 13. A n-type β-SiC layer 8 is selectively formed on the p-type highly-oriented diamond film 14 and a p-type β-SiC layer 7 is selectively formed on the n-type β-SiC layer 8. Further, an ohmic electrode 12 consisting of a Au/Ti bilayer is formed on the p-type highly-oriented diamond film 14 and the other ohmic electrode 15, consisting of $TaSi_2$, is formed on the n-type β-SiC layer 8, while an ohmic electrode 16 consisting of aluminum is formed on the p-type β-SiC layer 7.

In the HBT constructed as mentioned above, a bipolar-transistor in which the p-type highly-oriented diamond film 14 functions as an emitter, the n-type β-SiC layer 8 as a base, and the p-type β-SiC layer 7 as a collector can be obtained. This HBT has an advantage that since band gap of diamond (5.4 eV) is larger than that of β-SiC (2.2 eV), its carrier injection efficiency is higher than in other bipolar-transistors e.g. a homojunction bipolar-transistor utilizing the same semiconducting material. Therefore, the current amplification factor can be increased. Both diamond and SiC have an excellent heat stability and therefore the HBT can be used under high temperature (about 500° C.) conditions. And since it has a high dielectric breakdown field, it can be operated under a high current.

Figure 7:
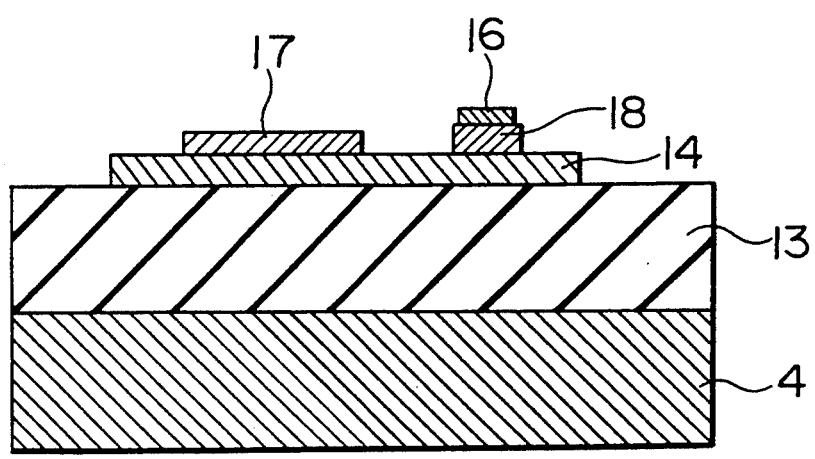
FIG. 7 is a cross-sectional view showing the diamond/Si rectifying element according to the third embodiment of the present invention.

FIG. 7 is a cross-sectional view showing the diamond hetero-junction rectifying element according to the third embodiment of the present invention. An undoped highly-oriented diamond film 13 is formed on a single crystal silicon substrate 4 and a p-type highly-oriented diamond film 14 is formed on the insulating highly-oriented diamond film 13. An ohmic electrode 17 formed of a Au/Ti bilayer is provided on the p-type highly-oriented diamond film 14 and the other ohmic electrode 16 formed of Al is also formed on the n-type poly-Si layer 18. By this arrangement, the p-n junction between the p-type highly-oriented diamond film 14 and the n-type poly-Si layer 18 is obtained.

The diamond hetero-junction rectifying element thus fabricated and its characteristics are compared with comparative examples. The results will be explained as follows: Steps 1 to 4 were the same as before, but in Step 1 the source gas of 2 5% methane and 97.5% hydrogen was used and the substrate temperature was 700° C. As a result, $(\Delta\alpha)^2+(\Delta\beta)^2+(\Delta\gamma)^2$ was 50.

(Step 5)

A 4000 Å thick P-doped n-type poly-Si layer 18 was grown on the p-type semiconducting diamond film 14 by a thermal CVD method. The film growth was performed for 40 minutes under the following conditions: the source gas was silane ($SiH_4$) at 100 ml/min, nitrogen ($N_2$) at 400 ml/min, phosphine ($PH_3$) at 0.14 ml/min and helium gas (He) at 27.8 ml/min, the gas pressure was 1 Torr, and the substrate temperature was 620° C.

(Step 6)

In order to activate P-doped poly-Si, the samples were heated for 30 minutes at 950° C. in $O_2$ atmosphere. As a result, a 200 Å thick oxidized layer was formed on the surface of the n-type polycrystalline silicon (poly-Si) layer 18.

(Step 7)

After the oxidized layer was removed by HF, silicon was etched with a mixture of $HF+HN_3+CH_3COOH$. Then, a dot pattern (n-type poly-Si layer 18) of 300 μm in diameter was obtained.

(Step 8)

The diamond surface after the silicon was etched out was sputter-cleaned with an Ar ion beam, and also cleaned with a hot mixture of chromic oxide and sulfuric acid, followed by aqua regia, RCA cleanings and HF cleanings.

(Step 9)

Subsequently, an ohmic electrode 17 (a dot of 2 mm in diameter) consisting of a Au/Ti bilayer and the other ohmic electrode 16 (a dot of 250 μm in diameter) consisting of Al were formed. Each rectifying element was separated by a dicing saw to prepare the diamond/Si rectifying element (This is referred to as example 2) according to the third embodiment of the present invention shown in FIG. 7.

As a comparative example 2, a diamond/Si rectifying element was prepared using polycrystalline diamond film. The (100) silicon wafer was used as the substrate and its surface was polished with diamond paste for about 1 hour. Then, samples were placed in a microwave CVD chamber to form a basal insulating diamond layer, and treated for 14 hours under the following conditions: the source gas was 0.5% methane, 99.4% hydrogen and 0.1% oxygen, the gas pressure was 35 Torr, the gas flow rate was 300 ml/min, and the substrate temperature was 800° C. Then, the diamond/Si rectifying element shown in FIG. 7 was prepared according to the process shown in Steps 3 to 9.

Figure 8:
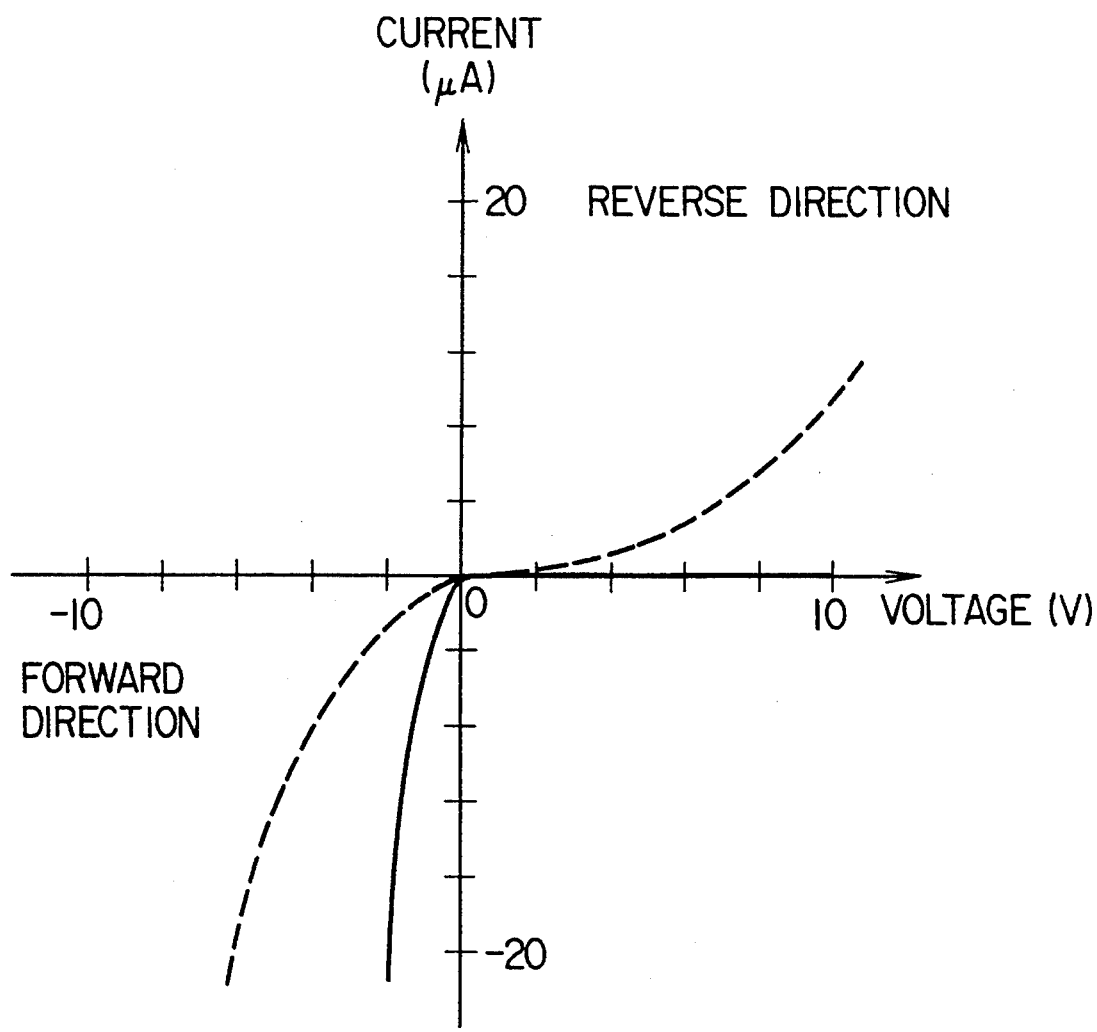
FIG. 8 is a graph showing the I-V characteristics of the hetero-junction rectifying element according to the example 2 of the present invention.
Figure 9:
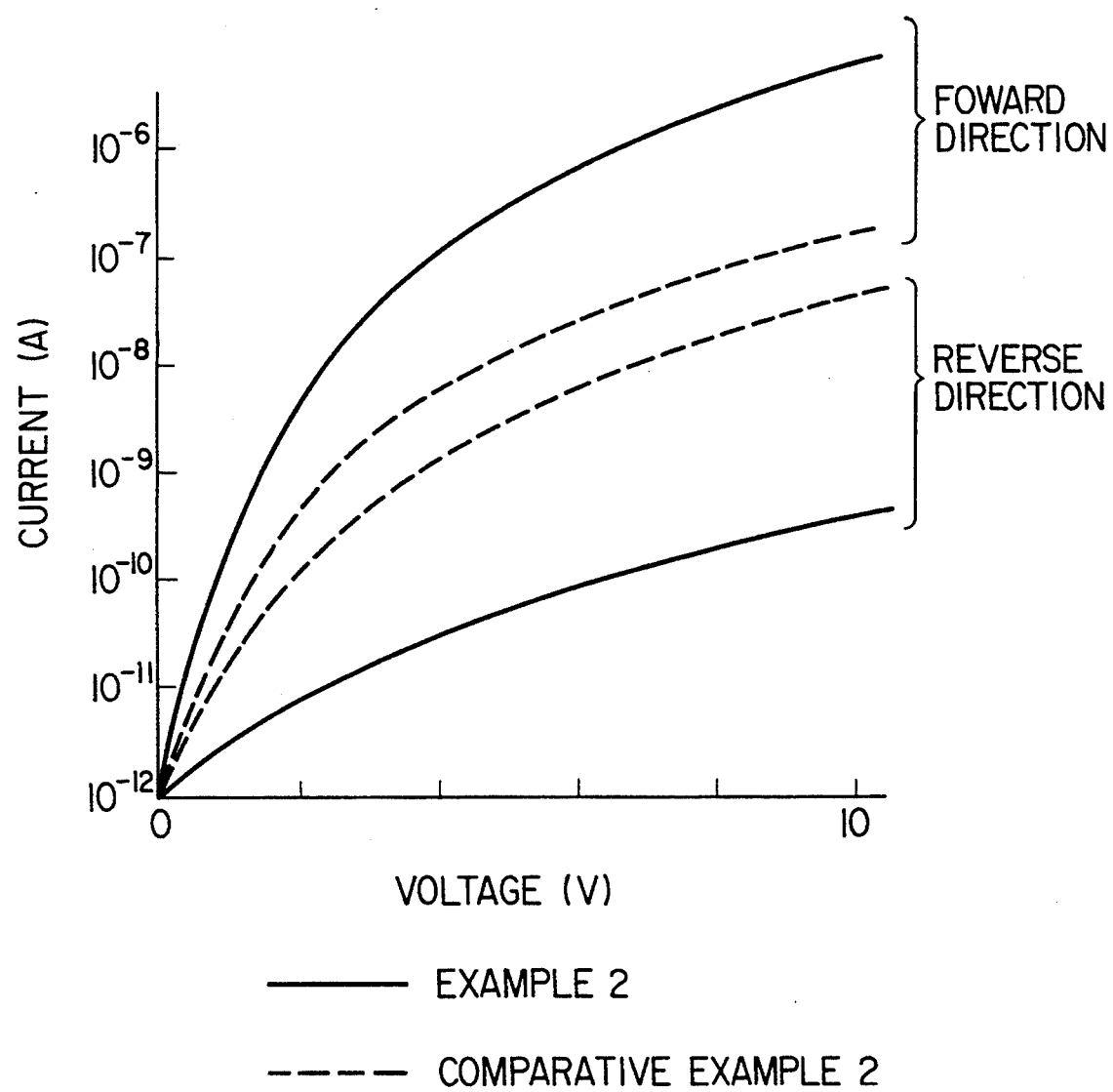
FIG. 9 is a graph showing the log I-V characteristics of the hetero-junction rectifying element according to the example 2 of the present invention.

The current-voltage (I–V) characteristics of the diamond/SiC rectifying element was measured using a probe at room temperature (24° C.). In FIG. 8, the I–V characteristics are shown by the solid line for the example 2 and by the dotted line for the comparative example 2. In FIG. 9, the log I–V characteristics are shown by the solid line for example 2 and by the dotted line for the comparative example 2. As seen from FIGS. 8 and 9, a significant reduction of the current in the reverse direction and an increased current flow in the forward direction were observed, compared with the comparative example 2, and thus the rectifying ratio was significantly improved. The dielectric breakdown voltage of the rectifying element of the example 2 was about 65 V and it showed the rectifying effect even at high temperature of 400° C. in air.

Figure 10:
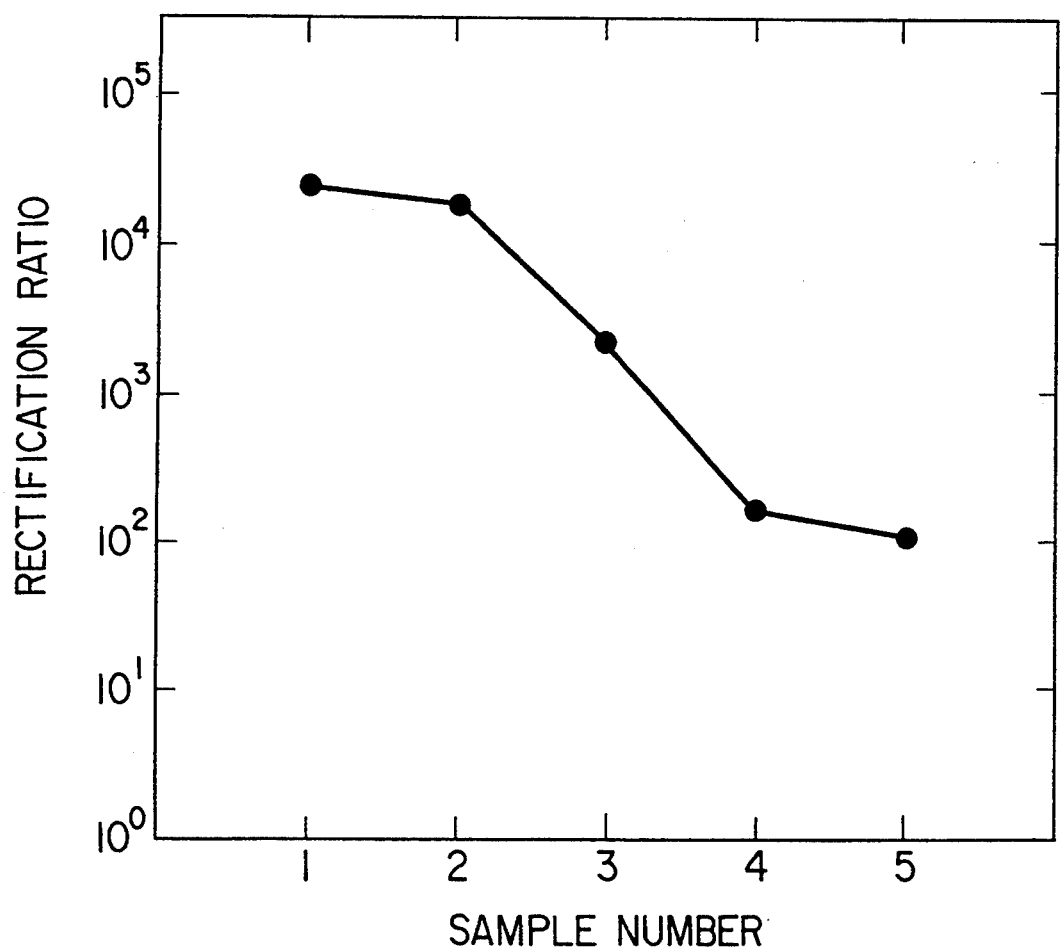
FIG. 10 is a graph showing the rectification ratio of the hetero-junction rectifying element according to the example 2 of the present invention, compared to the comparative example 2.
Figure 11:
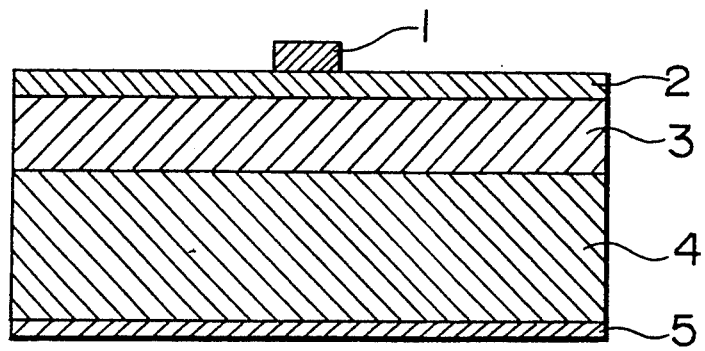
FIG. 11 is a cross-sectional view showing the a-Si:H-/diamond rectifying element according to the prior art 1.
Figure 12:
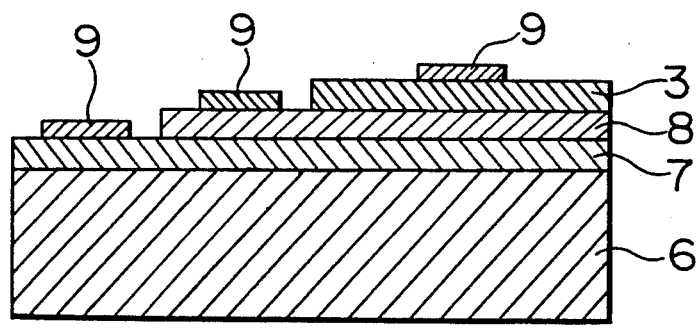
FIG. 12 is a cross-sectional view showing the diamond HBT according to the prior art 2.
Figure 13:
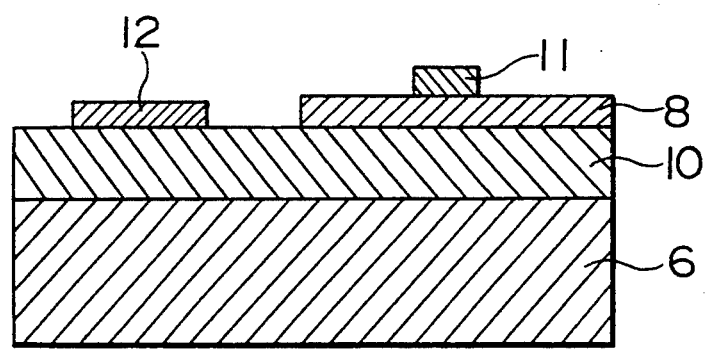
FIG. 13 is a cross-sectional view showing the hetero-junction rectifying element utilizing the single crystalline diamond film.

The diamond/Si rectifying elements having the structure shown in FIG. 7 were prepared by changing the conditions of Step 1 of the example 2 as listed in the preceding Table 2 and their I–V characteristics were measured at room temperature (24° C.). The rectifying ratio at ±10 V is shown in FIG. 10. The rectifying ratio for the samples 1 and 2 according to the present invention was around $\pm 10^4$, while for the samples 4 and 5 (which was out of the scope of the present invention) it decreased significantly. In the sample 3, the orientation ratio was slightly low and therefore the rectifying ratio was poor. Therefore, it is necessary to use the highly-oriented film defined in the present invention in order to obtain an excellent rectifying element.

TABLE 2

| Sample No. | Synthetic conditions | | | Coverage by (100) plane (%) | Δα, Δβ, Δγ |
|---|---|---|---|---|---|
| | $CH_4$ (%) | $H_2$ (%) | Substrate temp. (°C.) | | |
| 1 | 2.2 | 97.8 | 680 | 88 | All <5° |
| 2 | 2.5 | 97.5 | 700 | 85 | All <5° |
| 3 | 3.0 | 97.0 | 750 | 79 | Almost <5° Some >5° |
| 4 | 3.6 | 96.4 | 810 | 74 | All >5 |
| 5 | 4.0 | 96.0 | 850 | 70 | All >5° |

In the above embodiment, the Al electrode was formed on the n-type silicon layer as shown in FIG. 7. However, if silicon is doped at high concentration, the electrode is not necessary to be provided. In this case, silicon itself can be used as a rectifying electrode to diamond.

As mentioned before, according to the present invention, the diamond hetero-junction rectifying element having an excellent heat resistance as well as a high rectification ratio can be produced on large scale and at low cost.

What is claimed is:

1. A diamond hetero-junction rectifying element comprising,
a film of either silicon carbide or silicon, and
a highly-oriented diamond film which is grown by chemical vapor deposition, and which has a surface area consisting of at least 80% a plurality of (100) crystal planes, for which the differences $\{\Delta\alpha, \Delta\beta, \Delta\gamma\}$ of Euler angles $\{\alpha, \beta, \gamma\}$, which represent the orientations of the crystal planes, satisfy $0 \leq |\Delta\alpha| \leq 5°$, $0 \leq |\Delta\beta| \leq 5°$ and $0 \leq |\Delta\gamma| \leq 5°$ simultaneously between adjacent (100) crystal planes;
said highly oriented diamond film forming a hetero-junction with said film or either silicon carbide or silicon.

2. A diamond hetero-junction rectifying element comprising,
a film of either silicon carbide or silicon, and
a highly-oriented diamond film which is grown by chemical vapor deposition, and which has a surface area consisting of at least 80% a plurality of (111) crystal planes, for which the differences $\{\Delta\alpha, \Delta\beta, \Delta\gamma\}$ of Euler angles $\{\alpha, \beta, \gamma\}$ which represent the orientations of the crystal planes, satisfy $0 \leq |\Delta\alpha| \leq 5°$, $0 \leq |\Delta\beta| \leq 5°$ and $0 \leq |\Delta\gamma| \leq 5°$ simultaneously between adjacent (111) crystal planes;
said highly oriented diamond film forming a hetero-junction with said film of either silicon carbide or silicon.

3. A diamond hetero-junction rectifying element according to claim 1 wherein said film of either silicon carbide or silicon is cubic silicon carbide.

4. A diamond hereto-junction rectifying element according to claim 2 wherein said film of either silicon carbide or silicon is cubic silicon carbide.

5. A diamond hetero-junction rectifying element according to claim 1 wherein said film of either silicon carbide or silicon is made of a material selected from the group consisting of amorphous silicon, micro-crystalline silicon and polycrystalline silicon.

6. A diamond hereto-junction rectifying element according to claim 2 wherein said film of either silicon carbide or silicon is made of a material selected from the group consisting of amorphous silicon, micro-crystalline silicon and polycrystalline silicon.

* * * * *